United States Patent
Choi et al.

(10) Patent No.: US 10,304,547 B2
(45) Date of Patent: May 28, 2019

(54) MEMORY DEVICE AND CLOCK TRAINING METHOD THEREOF

(71) Applicant: SAMSUNG ELECTRONICS CO., LTD., Suwon-si, Gyeonggi-do (KR)

(72) Inventors: Yeonkyu Choi, Seoul (KR); Seungjun Shin, Incheon (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/700,324

(22) Filed: Sep. 11, 2017

(65) Prior Publication Data

US 2018/0122486 A1 May 3, 2018

(30) Foreign Application Priority Data

Oct. 27, 2016 (KR) .......................... 10-2016-0141207

(51) Int. Cl.
| | |
|---|---|
| *H01L 27/115* | (2017.01) |
| *G11C 16/32* | (2006.01) |
| *G11C 7/22* | (2006.01) |
| *G11C 29/02* | (2006.01) |

(52) U.S. Cl.
CPC .............. *G11C 16/32* (2013.01); *G11C 7/222* (2013.01); *G11C 29/023* (2013.01); *G11C 29/028* (2013.01); *G11C 2207/229* (2013.01); *G11C 2207/2245* (2013.01); *G11C 2207/2254* (2013.01); *G11C 2207/2281* (2013.01)

(58) Field of Classification Search
CPC .......................... H01L 27/115; H01L 27/11521

USPC ...................................................... 365/185.01
See application file for complete search history.

(56) References Cited

U.S. PATENT DOCUMENTS

| | | | |
|---|---|---|---|
| 7,528,626 B2 | 5/2009 | Kim | |
| 8,963,606 B2 | 2/2015 | Ko | |
| 8,966,151 B2 | 2/2015 | Zitlaw | |
| 9,026,725 B2 | 5/2015 | Kostinsky et al. | |
| 2009/0039927 A1* | 2/2009 | Gillingham | G06F 13/1694 327/156 |

(Continued)

OTHER PUBLICATIONS

Committee Letter Ballot, Solid State Technology Association, "Proposed LPDDR4 Specification Revision B", JEDEC, 2011, pp. 1-310.

(Continued)

*Primary Examiner* — Huan Hoang
*Assistant Examiner* — Minh Dinh
(74) *Attorney, Agent, or Firm* — F. Chau & Associates, LLC

(57) ABSTRACT

A training method for a memory device includes providing, at a memory controller, a clock signal to the memory device to synchronize a control signal at a reference time point of the clock signal. When the clock signal, such as a training clock signal, does not transition after the reference time point, a failure time point is found at which the memory device fails to sample the control signal at the reference time point, based on the clock signal and the control signal. A synchronization time point of the control signal may be set, at which the memory device secures a sampling margin for sampling the control signal at the reference time point, based on the failure time point. A sampler circuit may sample the control signal at an edge of a rising edge of the clock signal.

19 Claims, 11 Drawing Sheets

(56) References Cited

U.S. PATENT DOCUMENTS

| | | | |
|---|---|---|---|
| 2010/0182856 A1* | 7/2010 | Koshizuka | G11C 7/1051 |
| | | | 365/193 |
| 2011/0205832 A1 | 8/2011 | Jeon | |
| 2013/0339775 A1* | 12/2013 | Shaeffer | G11C 7/1072 |
| | | | 713/323 |
| 2014/0181392 A1 | 6/2014 | Malladi et al. | |
| 2014/0281161 A1 | 9/2014 | Chen et al. | |
| 2015/0213849 A1 | 7/2015 | Srinivas et al. | |
| 2015/0293864 A1 | 10/2015 | Hill et al. | |
| 2016/0372185 A1* | 12/2016 | Shim | G11C 11/5635 |

OTHER PUBLICATIONS

GSI Technology, "1.125Gb Low Latency DRAM III (LLDRAM III) Common I/O Burst of 2, POD I/O", 2013, pp. 1-50.

\* cited by examiner

FIG. 4
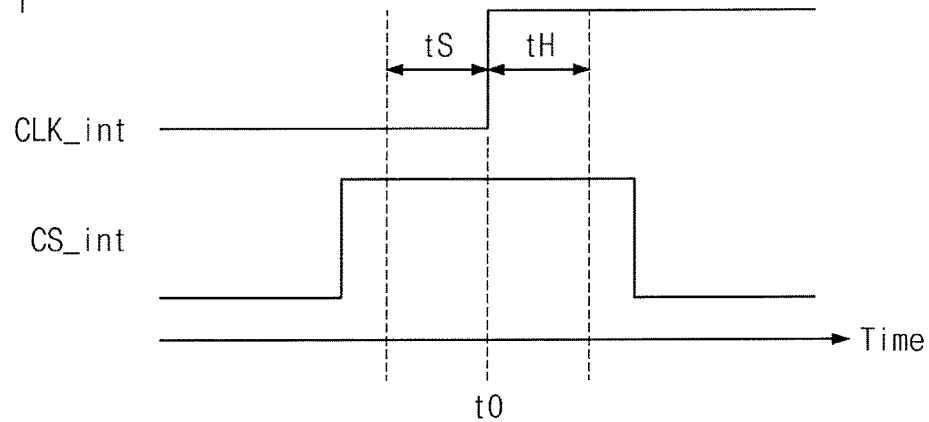
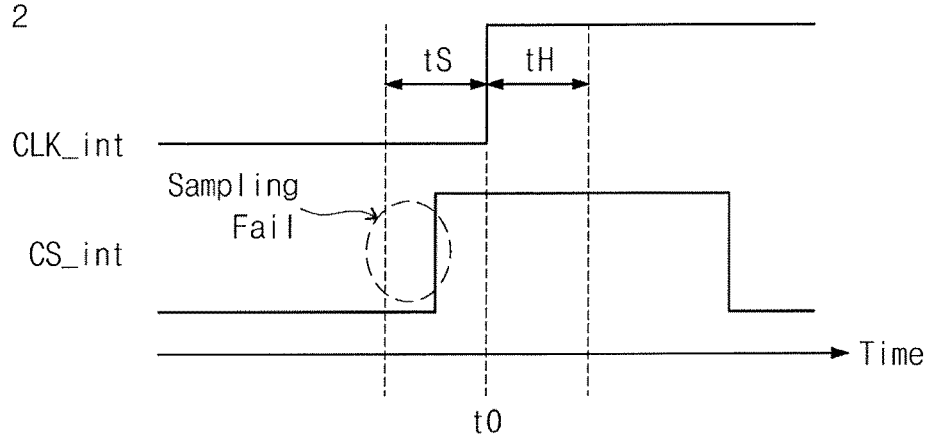
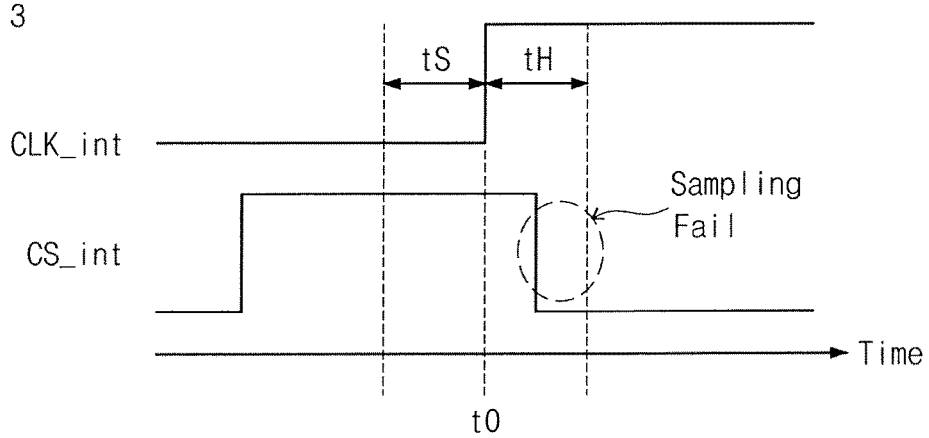

FIG. 9
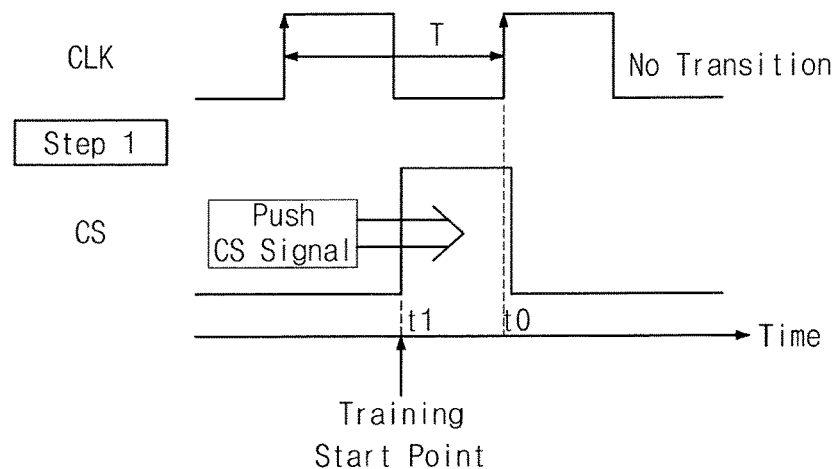
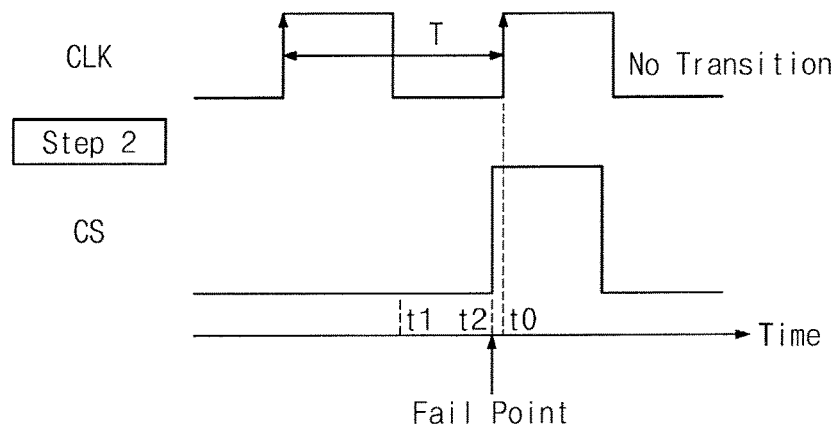
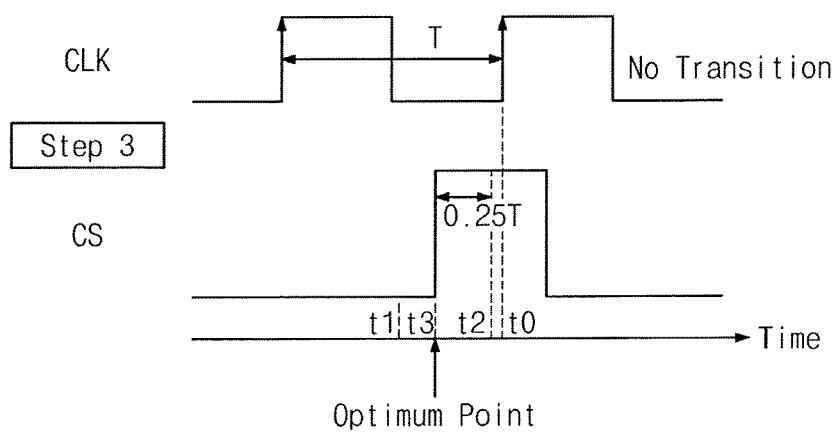

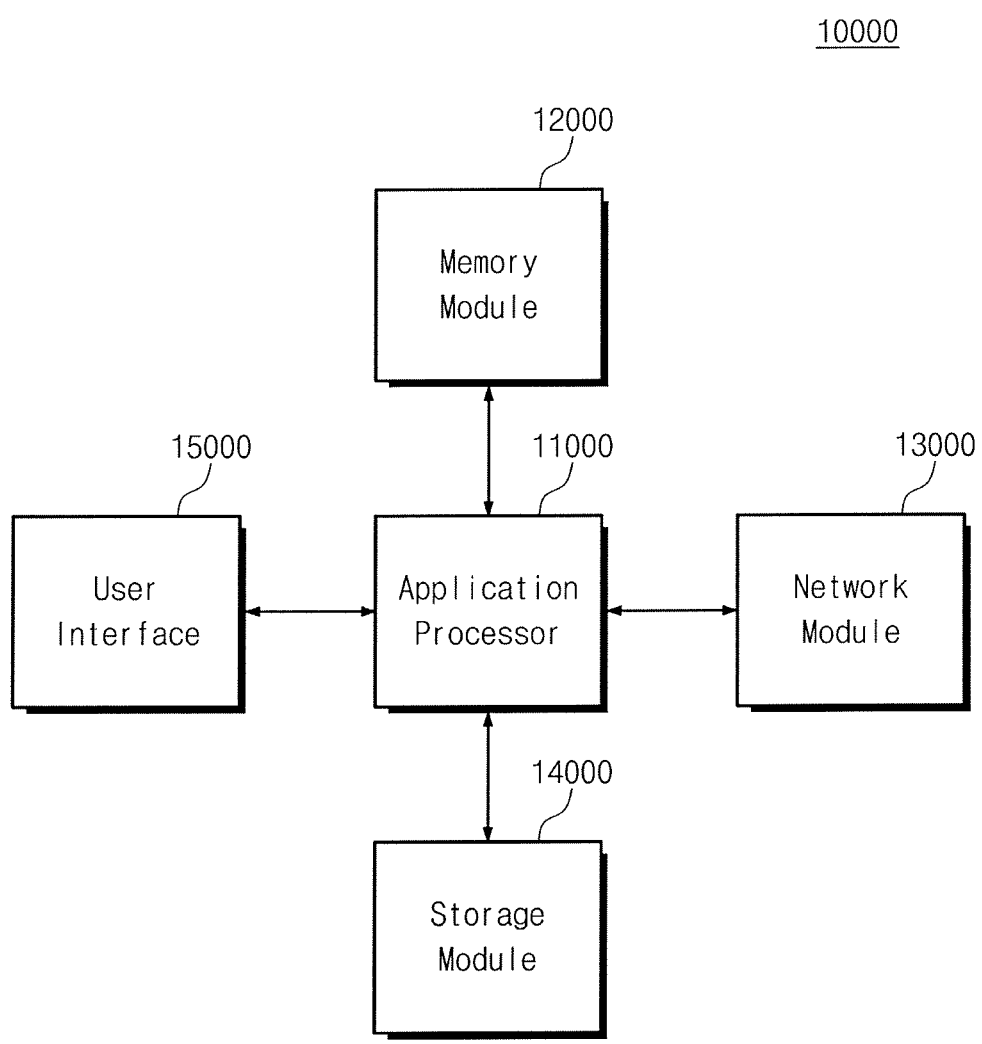

MEMORY DEVICE AND CLOCK TRAINING METHOD THEREOF

CROSS-REFERENCE TO RELATED APPLICATIONS

This application claims priority under 35 U.S.C. § 119 from Korean Patent Application No. 10-2016-0141207 filed Oct. 27, 2016, in the Korean Intellectual Property Office, the entire contents of which are hereby incorporated by reference herein.

TECHNICAL FIELD

Embodiments of the inventive concept disclosed herein relate to a semiconductor memory device, and in particular, to a memory device and a training method thereof.

DISCUSSION OF THE RELATED ART

There has been a dramatic increase in the use of mobile devices such as a smartphone, a tablet personal computer (PC), a digital camera, an MP3 player, personal digital assistant (PDA), and a wearable device. According to recent mobile trends, high integration, high performance, and low power are required for a semiconductor memory device for use in the mobile device.

An operating speed of a high-performance memory device is significantly faster than other types of memory devices, and a higher signal quality and reliability are required for data that an application processor and a memory device (e.g., a dynamic random access memory (DRAM) device) exchange. To secure the reliability of data, a reference voltage or clock timing of data or signals transferred through an interface should be optimized. The optimizing of the clock timing refers to an optimum synchronization that occurs between a clock signal (or a strobe signal) and data. The reference voltage provides a criterion for determining a logical value of data.

In general, training is performed on the DRAM for the reliability of data. Unlike data that the memory device exchanges with the application processor upon performing a normal operation (e.g., a read operation or a write operation), training data may be provided to the memory device in a state where a margin of operation is sufficiently secured for each training purpose.

Accordingly, if the memory device performs the normal operation after the training is completed, data that is exchanged between the application processor and the memory device while the margin of operation is smaller than that for the training operation is secured are synchronized at an unintended edge of a clock signal, or the margin of operation may be insufficient.

SUMMARY

According to an embodiment of the inventive concept, A training method includes providing, at a memory controller, a clock signal to a memory device to synchronize a control signal at a reference time point of the clock signal, in which the clock signal does not transition after the reference time point; finding a failure time point at which the memory device fails to sample the control signal at the reference time point of the clock signal, wherein the failure time point is based on the clock signal and the control signal.

According to an embodiment of the inventive concept, a memory device includes a latch including an input buffer and a sampler, in which the input buffer is configured to store a control signal received from a host and the sampler is configured to sample the control signal provided from the input buffer in synchronization with a clock signal provided from the host; a memory cell array in communication with the latch, the memory cell array stores training data; wherein in response to executing a training operation on the memory device that includes synchronization of the control signal at a reference time point of the clock signal, and wherein the clock signal does not transition after the reference time point, the training operation is executed based on a failure time point at which the sampler fails to sample the control signal at the reference time point.

According to an embodiment of the inventive concept, a memory device including a clock buffer that generates an internal clock signal based on an input from a host; an input buffer configured to store a control signal received from the host; a sampler configured to sample the control signal provided from the input buffer in synchronization with a reference time point of the internal clock signal; and a command address latch that receives a command signal and an address signal from the host; a memory cell array in communication with the sampler and the command address latch, the memory cell array configured to store training data. The control signal is synchronized with the internal clock signal in response to a control signal training operation initiated by the host, and the command signal is synchronized with the internal clock signal in response to a command signal training operation initiated by the host.

BRIEF DESCRIPTION OF THE DRAWINGS

FIG. 4 is a timing diagram illustrating an operation margin of a sampler illustrated in FIG. 3;

FIGS. 7, 8 and 9 are respective timing diagrams illustrating a training method, according to an embodiment of the inventive concept;

FIG. 11 is a block diagram illustrating a user system to which a memory device is applied, according to an embodiment of the inventive concept.

DETAILED DESCRIPTION

Below, embodiments of the inventive concept may be described in detail so that a person of ordinary skill in the art can practice the inventive concept.

Figure 1:
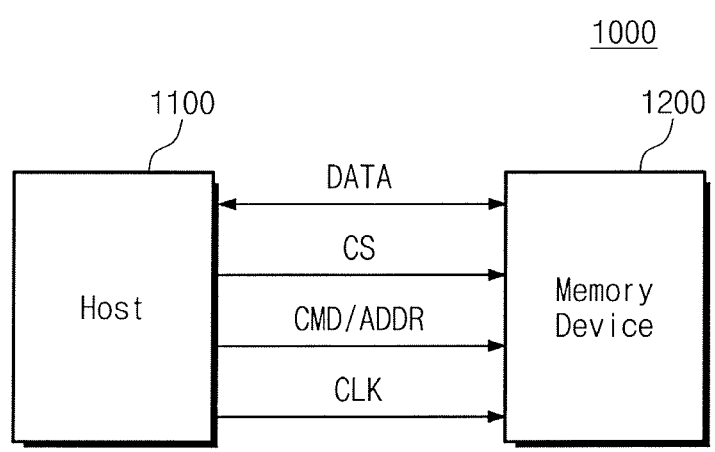
FIG. 1 is a block diagram illustrating a memory system, according to an embodiment of the inventive concept.

FIG. 1 is a block diagram illustrating a memory system, according to an embodiment of the inventive concept. Referring to FIG. 1, a memory system 1000 may include a host 1100 and a memory device 1200. For example, the memory system 1000 may be a single system that includes both the host 1100 and the memory device 1200. Alternatively, the host 1100 and the memory device 1200 of the memory system 1000 may be implemented with separate devices, respectively.

The host 1100 may be a processor circuit or system that includes a general-purpose processor or an application processor. Alternatively, the host 1100 may be, for example, the following: a computing device including one or more processors: a personal computer, a peripheral device, a digital camera, a personal digital assistant (PDA), a portable media player (PMP), a smartphone, a tablet computer, or a wearable device, just to name some possible non-limiting devices.

The host 1100 may perform training on the memory device 1200 in a booting or specific situation. The host 1100 may improve the reliability of data or signal exchange with the memory device 1200 by performing the training. For example, the host 1100 may write training data (TD) in or read from the memory device 1200 in various conditions to determine an optimum clock timing or an optimum reference level.

The memory device 1200 may store data provided from the host 1100 or data to be provided to the host 1100. The memory device 1200 may be implemented with any storage medium including a volatile memory or a nonvolatile memory. For example, in the case where the memory device 1200 includes a volatile memory, the memory device 1200 may include a DRAM, a static RAM (SRAM), a thyristor RAM (TRAM), a zero capacitor RAM (Z-RAM), a twin transistor RAM (TTRAM), a magnetoresistive RAM (MRAM), etc. Embodiments of the inventive concept may be also applied to all storage mediums each including a volatile memory. For example, the memory device 1200 may include an unbuffered dual in-line memory module (UDIMM), a registered DIMM (RDIMM), a load reduced DIMM (LRDIMM), a Non Volatile DIMM (NVDIMM), etc.

For example, in the case where the memory device 1200 includes a nonvolatile memory (NVM), the memory device 1200 may be an electrically erasable programmable read-only memory (EEPROM), a flash memory, an MRAM, a spin-transfer torque MRAM (STT-MRAM), a conductive bridging RAM (CBRAM), a ferroelectric RAM (FeRAM), a phase change RAM (PRAM), a resistive RAM (RRAM), a nanotube RRAM (RRAM), a polymer RAM (PoRAM), a nano-floating gate memory (NFGM), a holographic memory, a molecular electronic memory device, or an insulator resistance change memory. One or more bits may be stored in a unit cell of the nonvolatile memory. The above-described examples do not limit the scope of the inventive concept.

Herein below, for ease of description, it is assumed that the memory device 1200 includes a single memory device. However, as described above, a person of ordinary skill in the art should understand that the embodiments of the inventive concept may be applied to various storage devices.

The memory device 1200 may communicate with the host 1100. For example, the memory device 1200 may communicate with the host 1100 based on one or more of various wired communication protocols, such as a universal serial bus (USB), a small computer system interface (SCSI), PCIe, a mobile PCIe (M-PCIe), advanced technology attachment (ATA), parallel ATA (PATA), serial ATA (SATA), serial attached SCSI (SAS), integrated drive electronics (IDE), Firewire, universal flash storage (UFS), a transmission control protocol/Internet protocol (TCP/IP), and various wireless communication protocols, such as long term evolution (LTE), WiMax, global system for mobile communication (GSM), code division multiple access (CDMA), high speed packet access (HSPA), Bluetooth, near field communication (NFC), Wi-Fi, and radio frequency identification (RFID). The inventive concept is not limited to the above-described examples.

The memory device 1200 operates by control signals that are synchronized with a clock signal CLK. For example, the memory device 1200 is selected by a chip select signal CS provided from the host 1100. When the memory device 1200 is selected by the chip select signal CS, the memory device 1200 may perform a write operation and a read operation in response to the clock signal CLK and a command/address CMD/ADDR from the host 1100. An example of the write operation and the read operation of the memory device 1200 are discussed herein below.

In the case of a read operation, the memory device 1200 is provided with an active command and a row address (CMD/ADDR) together with the clock signal CLK from the host 1100. After a reference time, the memory device 1200 is provided with read command and a column address from the host 1100. Afterwards, the memory device 1200 provides requested data to the host 1100 after a specific time.

In the case of a write operation, first, the memory device 1200 is provided with the active command and the row address together with the clock signal CLK from the host 1100. After the reference time, the memory device 1200 is provided with a write command and a column address from the host 1100. Afterwards, the memory device 1200 is provided with data to be written from the host 1100. The memory device 1200 writes the received data in a memory area that is defined by the column and row addresses.

According to an embodiment of the inventive concept, the memory system 1000 performs training for synchronizing signals provided from the host 1100 to the memory device 1200 with a rising edge or a falling edge of the clock signal CLK. For example, the above-described signals may include the command/address signal CMD/ADDR, the chip select signal CS, etc. Herein below, the chip select signal CS from among the above-described signals will be described as an example. However, it may be easily understood that embodiments of the inventive concept are applied to a process of performing training on the command/address signal CMD/ADDR or data and a device that performs training.

When the host 1100 performs training on the chip select signal CS, the host 1100 tests whether the chip select signal CS is sampled by adjusting a timing of the chip select signal CS such that the chip select signal CS is synchronized at a reference time point of the clock signal CLK. In addition, the host 1100 determines whether the chip select signal CS is synchronized at the reference time point of the clock signal CLK, based on the test result. When the host 1100 performs training, the host 1100 provides the memory device 1200 with the clock signal CLK that does not transition after the reference time point. Herein below, the clock signal CLK that does not transition after the reference time point is referred to as a "training clock signal CLK". The host 1100 performs training on the chip select signal CS based on the training clock signal CLK and finds an optimum synchronization time point of the chip select signal CS, at which the memory device 1200 secures a sampling margin for sampling the chip select signal CS at the reference time point, through the training operation.

The host 1100 that performs training based on the training clock signal CLK and a configuration of the memory device 1200 that is trained by the host 1100 are described above. Through the above-described configuration, timing margin of signals that the host 1100 provides to the memory device 1200 increases, and the above-described signals may be prevented from being synchronized at an unintended edge of the clock signal CLK. Also, communication quality may be affected because a timing margin of the signals are secured by setting an optimum synchronization time point for synchronizing the signals with the clock signal CLK.

Figure 2:
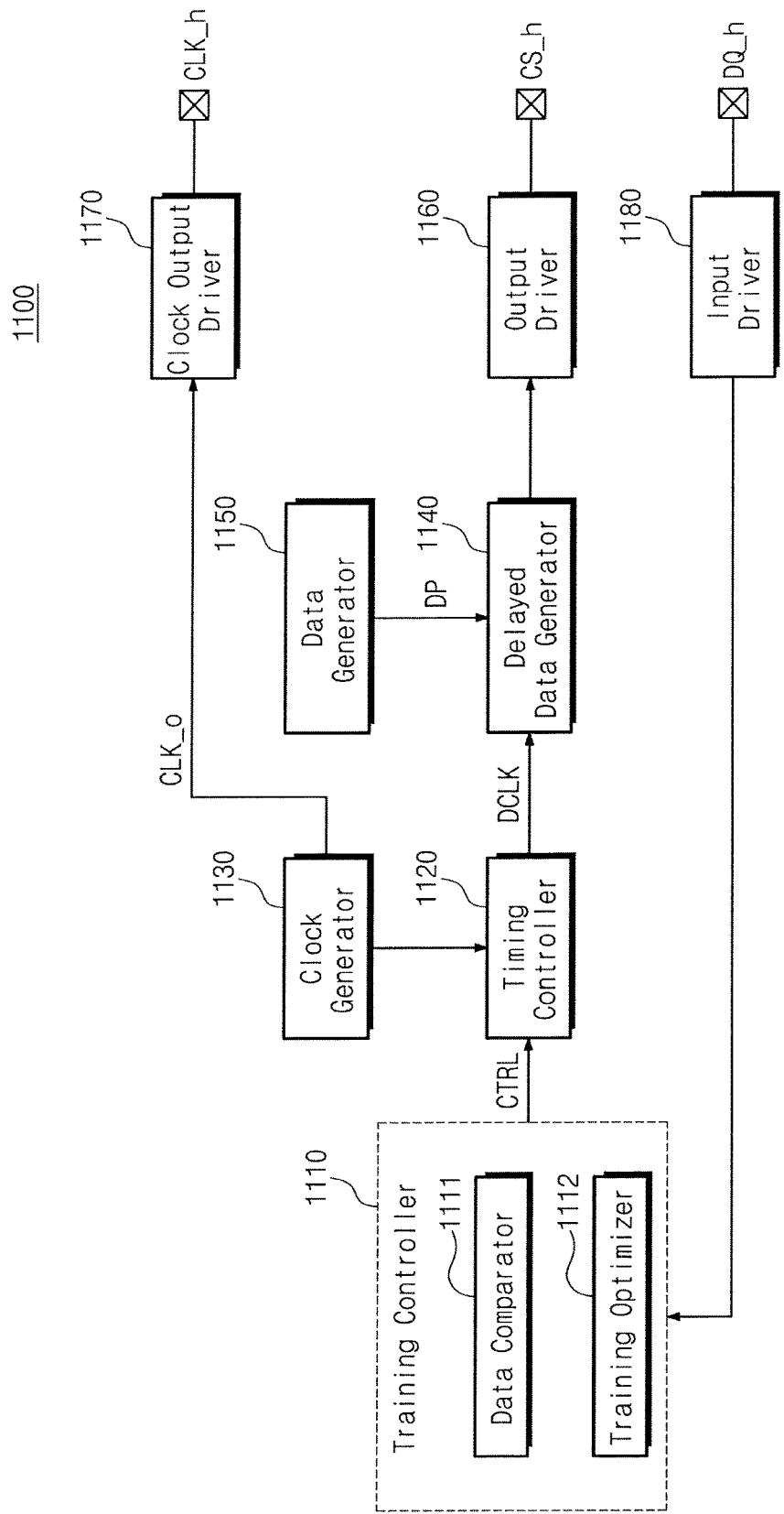
FIG. 2 is a block diagram illustrating a host illustrated in FIG. 1.

FIG. 2 is a block diagram of a host illustrated in FIG. 1. Therefore, FIG. 2 will be described with reference to FIG. 1. Referring to FIG. 2, the host 1100 may include a training controller 1110, a timing controller 1120, a clock generator 1130, a delayed data generator 1140, a data generator 1150, an output driver 1160, a clock output driver 1170, and an input driver 1180. A configuration of the host 1100 of FIG. 2 is provided for illustrative purposes, and embodiments of the inventive concept are not limited thereto.

Although not shown in FIG. 2, the host 1100 may further include a configuration for providing the memory device 1200 with training data, the command/address signal CMD/ADDR for writing the training data in the memory device 1200, and the training clock signal CLK.

When the host 1100 performs training on the chip select signal CS, the host 1100 may provide the memory device 1200 with the training data, a command CMD for reading or writing the training data, an address ADDR of the training data for a write operation or a read operation, and a training clock signal CLK together with the chip select signal CS. Also, when the host 1100 performs the training on the chip select signal CS, the host 1100 provides the memory device 1200 with the command/address signal CMD/ADDR having a sufficient operation margin. The reason is that the remaining factors other than the timing margin of the chip select signal CS can also have an influence on the training.

When the chip select signal CS is not sampled by the memory device 1200, the memory device 1200 is not selected by the host 1100, and the command/address signal CMD/ADDR may not normally be sent to the memory device 1200.

In contrast, when the chip select signal CS is sampled by the memory device 1200, the memory device 1200 is selected by the host 1100, and thus is operating normally. The selected memory device 1200 reads training data from a memory area designated by the command/address signal CMD/ADDR. The host 1100 determines whether the chip select signal CS is successfully sampled, by comparing the read training data with the training data that the host 1100 sends.

With continued reference to FIG. 2, the training controller 1110 generates a control signal CTRL for controlling the timing controller 1120. The training controller 1110 generates delayed data through the control signal CTRL and provides the delayed data to the memory device 1200. The training controller 1110 may include a data comparator 1111 and a training optimizer 1112. The data comparator 1111 compares a pattern of data, which are read from the memory device 1200 through the training, with a training data pattern. The data comparator 1111 determines whether the chip select signal CS is successfully sampled by a sampler (not illustrated) of the memory device 1200, based on the comparison result.

In addition, based on a determination result of the data comparator 111, the training optimizer 1112 may find a sampling failure time point, at which the chip select signal CS is not successfully sampled by the memory device 1200. Also, the training optimizer 1112 may set an optimum synchronization time point of the chip select signal CS with respect to the clock signal CLK, based on the sampling failure time point. A method in which the training optimizer 1112 finds the optimum synchronization time point of the chip select signal CS will be described herein when discussing FIGS. 7 to 9.

The timing controller 1120 is provided with the control signal CTRL from the training controller 1110, and an internal clock signal from the clock generator 1130, respectively. The timing controller 1120 generates a delayed clock signal DCLK in response to the control signal CTRL.

The clock generator 1130 generates the clock signal to be provided to the timing controller 1120. The clock generator 1130 may generate an output clock signal CLK_o for read and write operations of the memory device 1200. Also, when the host 1100 performs training, the clock generator 1130 may generate a training clock signal that does not transition after a reference time point and may output the training clock signal as the output clock signal CLK_o. The output clock signal CLK_o is provided to the memory device 1200 through the clock output driver 1170. For example, the clock generator 1130 may include a phase locked loop (PLL) circuit or a circuit for generating the training clock signal CLK by masking the clock signal.

With continued reference to FIG. 2, the delayed data generator 1140 is provided with a delayed clock signal DCLK and a data pattern DP from the timing controller 1120 and the data generator 1150, respectively. The delayed data generator 1140 generates delayed data by synchronizing the data pattern DP with the delayed clock signal DCLK. A delay time of the delayed data may be adjusted by the control signal CTRL of the training controller 1110, and an initial delay time may be set to "0".

The data generator 1150 generates the data pattern DP for performing training. According to an embodiment of the inventive concept, the data generator 1150 may generate a pattern of the chip select signal CS.

Referring to the drivers 1160, 1170 and 1180 shown in FIG. 2, the output driver 1160 provides the delayed data, which are provided from the delayed data generator 1140, to the memory device 1200 through a host CS pad CS_h. The clock output driver 1170 provides the output clock signal CLK_o to the memory device 1200 through a host clock pad CLK_h. The input driver 1180 receives the training data read from the memory device 1200 through a pad DQ_h and provides the received training data to the training controller 1110.

Figure 3:
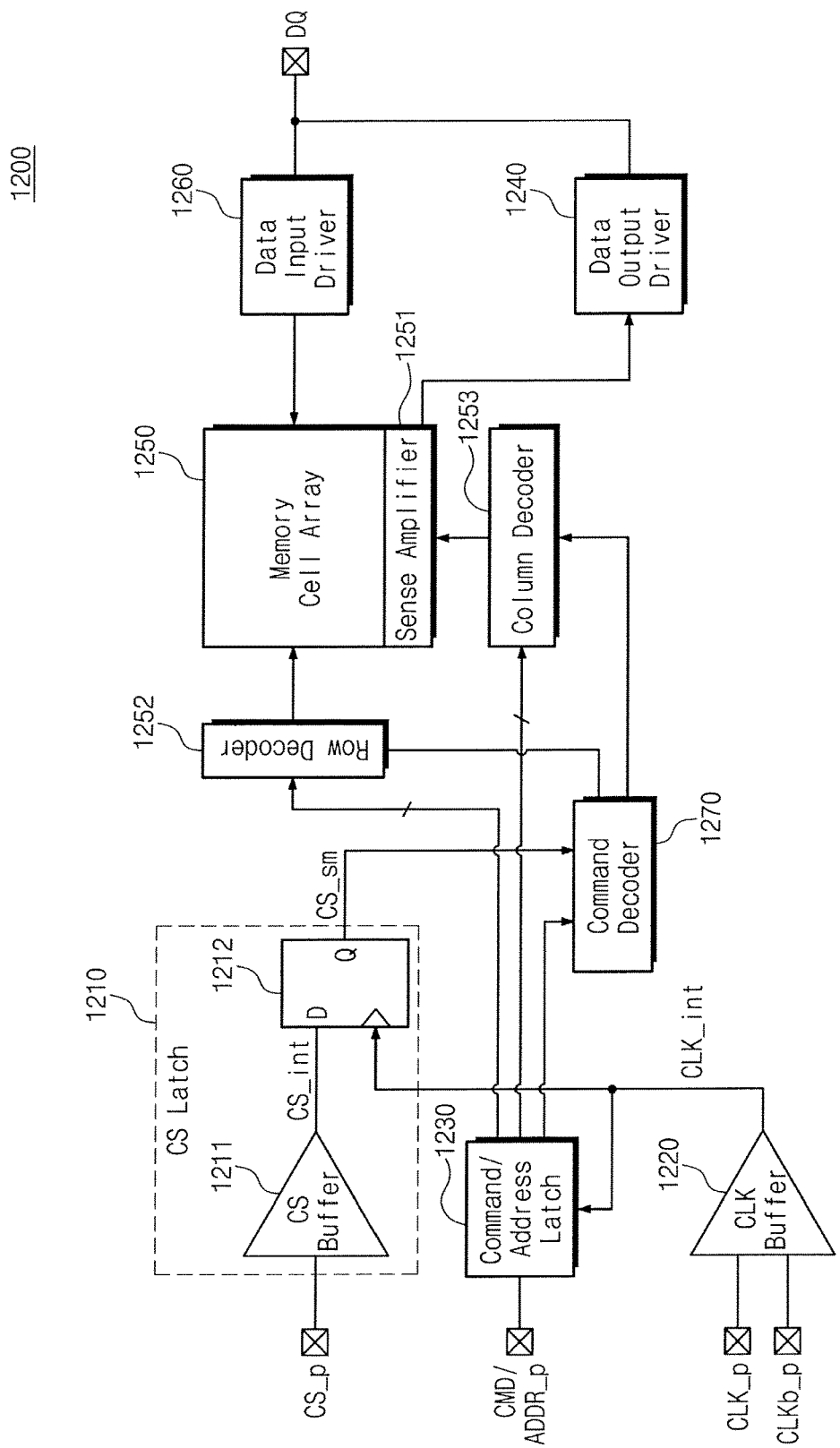
FIG. 3 is a block diagram illustrating a memory device illustrated in FIG. 1.

FIG. 3 is a block diagram illustrating a memory device shown in FIG. 1. FIG. 3 will be described with reference to FIG. 1. Referring to FIG. 3, the memory device 1200 may include, for example, a CS latch 1210, a clock buffer 1220, a command/address latch 1230, a data output driver 1240, a memory cell array 1250, a data input driver 1260, and a command decoder 1270.

The CS latch 1210 may include a CS buffer 1211 and a sampler 1212. The CS buffer 1211 receives the chip select signal CS from the host 1100 through a CS pad CS_p. The CS buffer 1211 is provided with a reference voltage (not illustrated) to determine a logical level of the chip select signal CS. For example, the reference voltage may be generated by an internal voltage generator (not illustrated), a voltage adjuster (not illustrated), etc. of the memory device 1200. Alternatively, the reference voltage may be provided from the host 1100. In an embodiment, a level of the reference voltage provided to the CS buffer 1211 may change with a signaling manner with the host 1100. The CS buffer 1211 determines a logical level of the chip select signal CS based on a level of the reference voltage and outputs the determined chip select signal CS as an internal CS signal CS_int. The internal CS signal CS_jnt is provided to the sampler 1212.

The sampler 1212 is provided with the internal CS signal CS_int from the CS buffer 1211 and an internal clock signal CLK_int from the clock buffer 1220, respectively. In the example shown in FIG. 3, the sampler 1212 is implemented with a flip-flop. The sampler 1212 samples the internal CS signal CS_int at at least one of a rising edge and a falling edge of the internal clock signal CLK_int. The sampled internal CS signal CS_int is then output as a sampling CS signal CS_sm. The output sampling CS signal CS_sm is provided to the command decoder 1270. An operation of the sampler 1212 will now be described with reference to FIG. 4.

Herein below, it is assumed that the sampler 1212 samples the internal CS signal CS_int at the rising edge of the internal clock signal CLK_int. For example, the chip select signal CS is provided to the memory device 1200 in a single data rate (SDR) manner and the sampler 1212 samples the chip select signal CS based on the rising edge of the internal clock signal CLK_int. However, a person or ordinary skill in the art should appreciate that the aforementioned description is applicable to the sampler 1212 that samples the internal CS signal CS_int at the falling edge of the internal clock signal CLK_int and the memory device 1200 that includes the sampler 1212. Also, embodiments of the inventive concept may be applied to the memory device 1200 to which the chip select signal CS is provided in a double data rate (DDR) manner, as disclosed herein below.

A method of training the memory device 1200 to which the chip select signal CS is provided in the DDR manner will now be described with reference to FIGS. 3 and 9.

The clock buffer 1220 is provided with the clock signal CLK and a clock bar signal CLKb from the host 1100 through a clock pad CLK_p and a clock bar pad CLKb_p, respectively. In an example based on FIG. 3, the clock buffer 1220 may be implemented with a differential input buffer. The clock buffer 1220 generates the internal clock signal CLK_int based on the clock signal CLK and the clock bar signal CLKb. The internal clock signal CLK_int is provided to the sampler 1212.

With continued reference to FIG. 3, the command/address latch 1230 receives a command signal CMD and an address signal ADDR from the host 1100. The command/address latch 1230 provides the received command to the command decoder 1270. Also, the command/address latch 1230 provides the received address to a row decoder 1252 and a column decoder 1253.

The data output driver 1240 may output data stored in the memory cell array 1250 through the DQ pad DQ to the host 1100. As described with reference to FIG. 2, when training is performed on the memory device 1200, when the chip select signal CS is sampled by the CS latch 1210, a sense amplifier 1251 reads training data, which is stored in advance, from a memory area of the memory cell array 1250, which may be designated by an address from the host 1100. The data output driver 1240 may provide the training data from the sense amplifier 1251 to the host 1100 through the DQ pad DQ. To this end, memory cells of the memory cell array 1250, in which data to be output are stored, may be selected by the row decoder 1252 and the column decoder 1253 that are provided with the address.

With continued reference to FIG. 3, data stored in the memory cell array 1250 may be provided to the data output driver 1240 through the sense amplifier 1251. Alternatively, data received from the data input driver 1260 may be stored in a memory area of the memory cell array 1250 corresponding to the address through the sense amplifier 1251.

The data provided to the data input driver 1260 may be stored in the memory cell array 1250 through the sense amplifier 1251. An address of memory cells, in which data provided from the host 1100 is to be stored, may be provided to the command/address latch 1230, the row decoder 1252, and the column decoder 1253.

The command decoder 1270 is provided with various commands through the CS latch 1210 and the command/address latch 1230. The command decoder 1270 may provide a decoded command to elements such as the row decoder 1252 and the column decoder 1253.

FIG. 4 is a timing diagram illustrating operation margin of a sampler circuit illustrated in FIG. 3. FIG. 4 will be described with reference to FIGS. 1 and 3. Referring to FIG. 4, a setup time tS and a hold time tH of the sampler 1212 when the internal clock signal CLK_int and the internal CS signal CS_int are provided as illustrated.

At "t0", the internal clock signal CLK_int provided to the sampler 1212 transitions from logic "0" to logic "1". A transition from logic "0" to logic "1" of the internal clock signal CLK_int is referred to as a "rising edge", and a transition from logic "1" to logic "0" of the internal clock signal CLK_int is referred to as a "falling edge". Here, an embodiment is illustrated as the sampler 1212 samples the internal CS signal CS_int at the rising edge. However, as described above, the sampler 1212 may be configured to sample data at the falling edge.

The setup time tS refers to a time when the internal CS signal CS_int remains at a stable logical level (e.g. remains at a logic "1" or logic "0") during a period of time before the rising edge of the internal clock signal CLK_int. The hold time tH refers to a time when the internal CS signal CS_int remains at a stable logical level (e.g. remains at a logic "1" or logic "0") during a period of time after the rising edge of the internal clock signal CLK_int.

Accordingly, for the sampler 1212 to sample the internal CS signal CS_int at the rising edge and to maintain the sampled logical level, the internal CS signal CS_int remains at a stable logical level during the setup time tS and the hold time tH of the sampler 1212. A first case (Case 1) shows that the internal CS signal CS_int remains at a stable logical level during the setup time tS and the hold time tH. In Case 1, the sampler 1212 samples logic "1" of the internal CS signal CS_int at "t0" and maintains the sampled logical level until a next rising edge of the internal clock signal CLK_int.

In a second case (Case 2) where the internal CS signal CS_int does not remain at the stable logical level during the setup time tS, the sampler 1212 in Case 2 fails to recognize a logical level of the internal CS signal CS_int. For example, the sampler 1212 fails to sample the internal CS signal CS_int at the rising edge of the internal clock signal CLK_int due to insufficient margin of the setup time tS.

Also, in a third case (Case 3) where the internal CS signal CS_int does not remain at the stable logical level during the hold time tH, the sampler 1212 fails to maintain a logical level of the internal CS signal CS_int that is recognized at the rising edge. For example, the sampler 1212 fails to sample the internal CS signal CS_int at the rising edge of the internal clock signal CLK_int due to an insufficient margin of the hold time tH.

Figure 5:
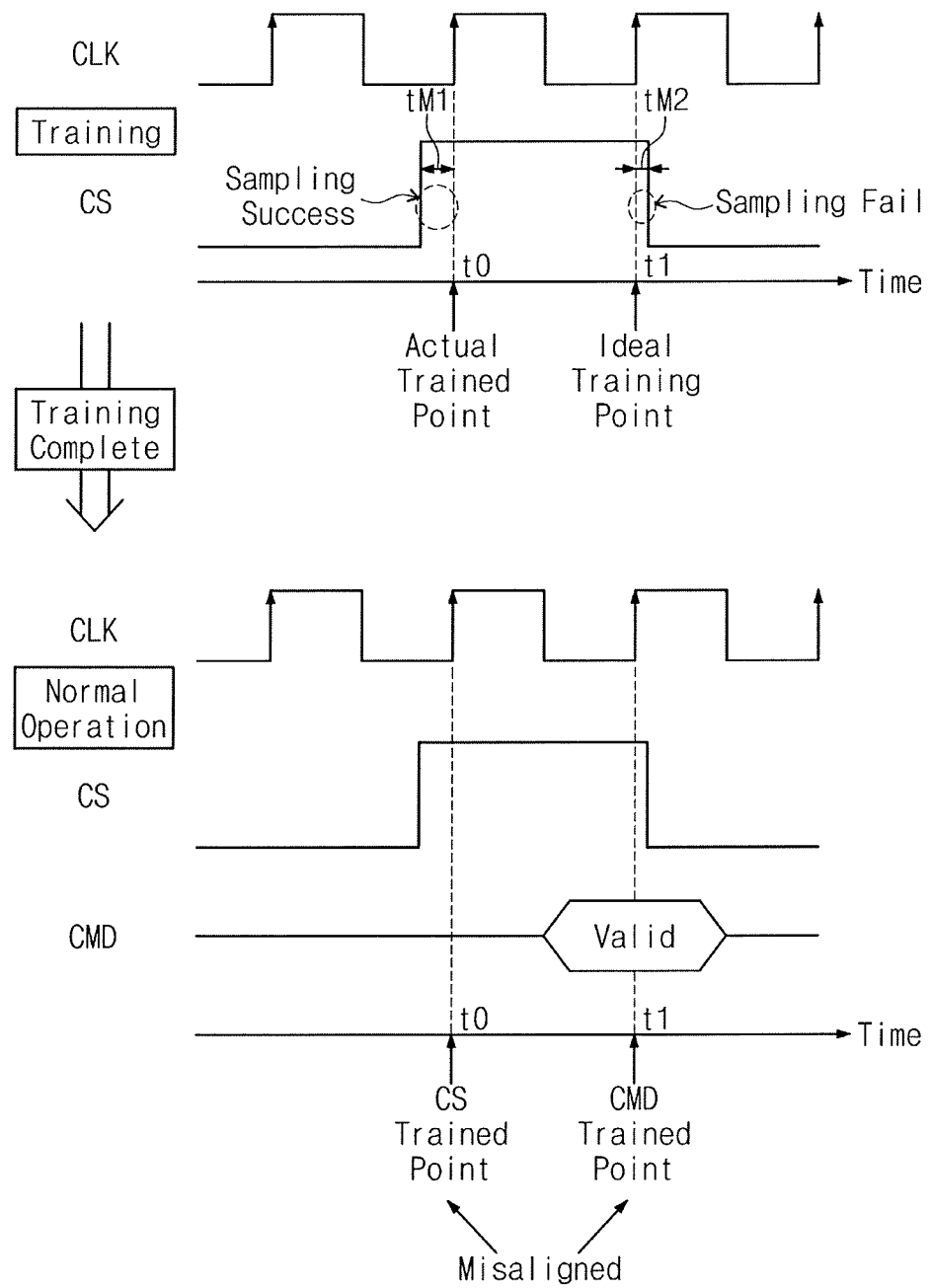
FIGS. 5 and 6 are timing diagrams illustrating signals generated when a memory system illustrated in FIG. 1 operates.
Figure 6:
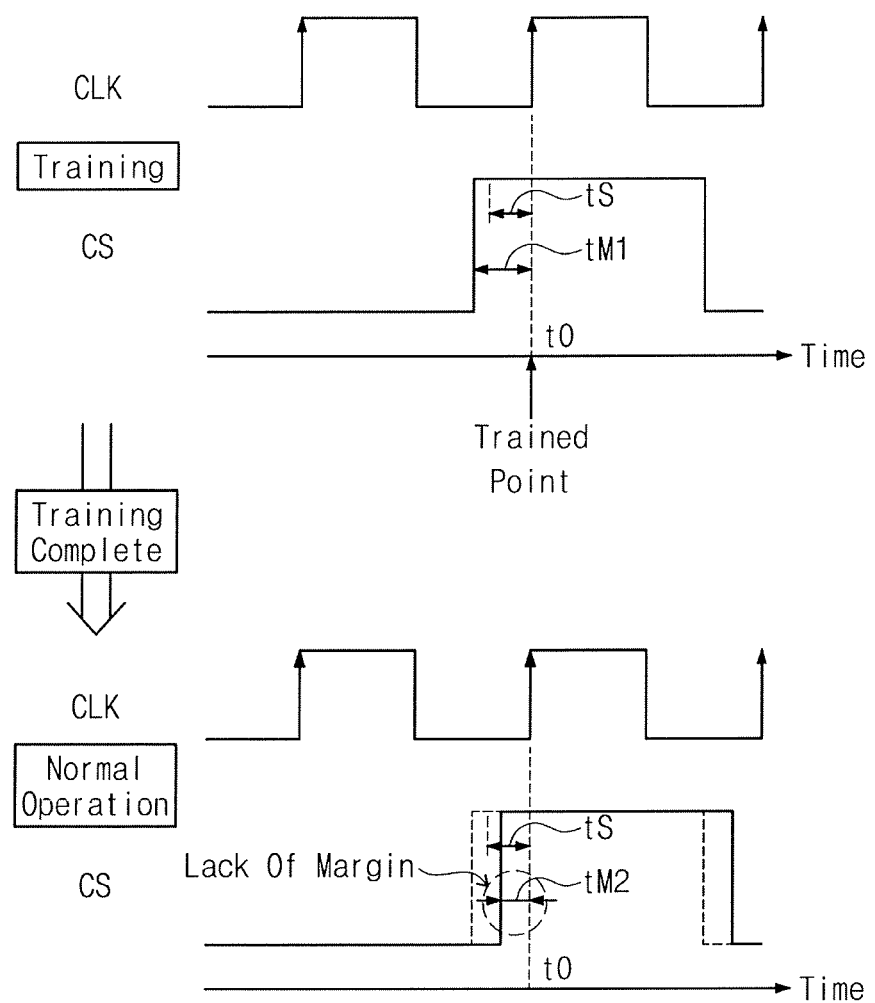

FIGS. 5 and 6 are timing diagrams illustrating signals generated when a memory system illustrated in FIG. 1 is operational. FIGS. 5 and 6 will be described with reference to FIGS. 1 and 3. Referring to FIGS. 5 and 6, the result of training that the memory system 1000 is performed by using a free running clock signal that continuously transitions as shown.

In FIG. 5, a timing of the chip select signal CS and a command signal CMD, which corresponds to a normal operation of the memory device 1200 after the memory device 1200 samples the chip select signal CS is illustrated. In an embodiment shown in FIG. 5, the memory system 1000 performs training to synchronize the chip select signal CS at the rising edge of the clock signal CLK at a time point "t1" ideally. In a training operation of the chip select signal CS provided to the memory device 1200 in the SDR manner, ideally, the chip select signal CS that remains at a logical level during a time of one period of the clock signal CLK may be applied to the memory device 1200. However, as illustrated in FIG. 5, because of noise, transmission environment of signal etc, the chip select signal CS that remains at a logical level during a time longer than one period of the clock signal CLK may be applied to the memory device 1200.

With reference to FIG. 5, in the training operation, the chip select signal CS has a setup margin of the first margin tM1 from a time point "t0" and has a hold margin of the second margin tM2 from a time point "t1" is provided to the memory device 1200. Here, it is assumed that the first margin tM1 is longer than the setup time tS of the sampler 1212 and the second margin tM2 is shorter than the hold time tH of the sampler 1212.

At the rising edge of the clock signal CLK corresponding to the time point "t1", since the second margin tM2 is shorter in duration than the hold time tH of the sampler 1212, the sampler 1212 may fail to sample the chip select signal CS due to an insufficient hold margin.

However, the chip select signal CS may have the first margin tM1, which is capable of securing the setup time tS of the sampler 1212, at the rising edge of the clock signal CLK corresponding to the time point "t0". Also, as illustrated in FIG. 5, the chip select signal CS has a margin in which the hold time tH of the sampler 1212 is sufficiently secured is provided to the memory device 1200 at the time point "t0". Accordingly, unlike a training purpose of the memory system 1000, the sampler 1212 succeeds in sampling the chip select signal CS at the rising edge of the clock signal CLK corresponding to the time point "t0".

Accordingly, in the sampling operation of the chip select signal CS that the host 1100 provides to the memory device 1200 for synchronization between the clock signal CLK and the chip select signal CS at the time point "t1", since the memory device 1200 succeeds in sampling the chip select signal CS at the time point "t0", the memory system 1000 considers (e.g. determines) that the chip select signal CS is synchronized at the rising edge of the clock signal CLK corresponding to "t1" as intended. Accordingly, while the chip select signal CS is actually synchronized at the rising edge corresponding to "t0", the memory system 1000 may complete the training for synchronizing the chip select signal CS at the rising edge of the clock signal CLK corresponding to the time point "t1".

Although not illustrated in the drawings, the memory system 1000 may additionally perform training for synchronizing the command signal CMD at the rising edge of the clock signal CLK corresponding to the time point "t1". The memory system 1000 performs training for synchronizing the command signal CMD at the rising edge of the clock signal CLK corresponding to the time point "t1", which may be similar to the training purpose of the chip select signal CS. Here, it is assumed that the command signal CMD is synchronized at the rising edge of the clock signal CLK corresponding to the time point "t1" and the training on the command signal CMD is completed. It is also possible to synchronize the command signal CMD at the falling edge of the clock signal.

After the training is performed on the chip select signal CS and the command signal CMD, the memory device 1200 performs the write and read operations described with reference to FIG. 1 based on the training result. However, in the embodiment shown in FIG. 5, the chip select signal CS may be synchronized at the rising edge of the clock signal CLK at the time point "t0", and the command signal CMD may be synchronized at the rising edge of the clock signal CLK at the time point "t1". Accordingly, the memory device 1200 may fail to be provided with the chip select signal CS and the command signal CMD at the same time point. With reference to the above description, a timing when the command decoder 1270 of the memory device 1200 receives and decodes the chip select signal CS and the command signal CMD is problematic, and thus, the memory device 1200 may fail to operate normally.

In an embodiment of the inventive concept shown in FIG. 6, the memory system 1000 performs training to synchronize the chip select signal CS at the rising edge of the clock signal CLK at a time point "t0". First, in the training operation, the chip select signal CS that has a setup margin of first margin tM1 from the time point "t0" is provided to the memory device 1200. Here, it is assumed that the first margin tM1 does not have sufficient margin even though the first margin tM1 is longer than the setup time tS of the sampler 1212. As illustrated in FIG. 6, the chip select signal CS provided to the memory device 1200 has margin in which the hold margin of the sampler 1212 is sufficiently secured. Accordingly, the sampler 1212 succeeds in sampling the chip select signal CS at the time point "t0", and the memory system 1000 completes training for synchronizing the chip select signal CS at the rising edge of the clock signal CLK at the time point "t0".

With continued reference to FIG. 6, after the training is completely performed on the chip select signal CS, the memory device 1200 performs the write and read operations described with reference to FIG. 1 based on the training result. However, as illustrated in FIG. 6, the chip select signal CS that is delayed by a time with respect to a time point provided upon performing training may be provided to the memory device 1200. It is because of factors such as noise of a voltage supplied to the memory system 1000 and cross-talk between signals. In this case, the sampler 1212 fails to sample the chip select signal CS due to an insufficient setup time tS thereof. With the above description, the memory system 1000 that performs training on the chip select signal CS by using a free running clock signal CLK fails to provide the memory device 1200 with a synchronization time point of the chip select signal CS, at which the setup time tS and the hold time tH of the sampler 1212 are sufficiently secured.

Figure 7:
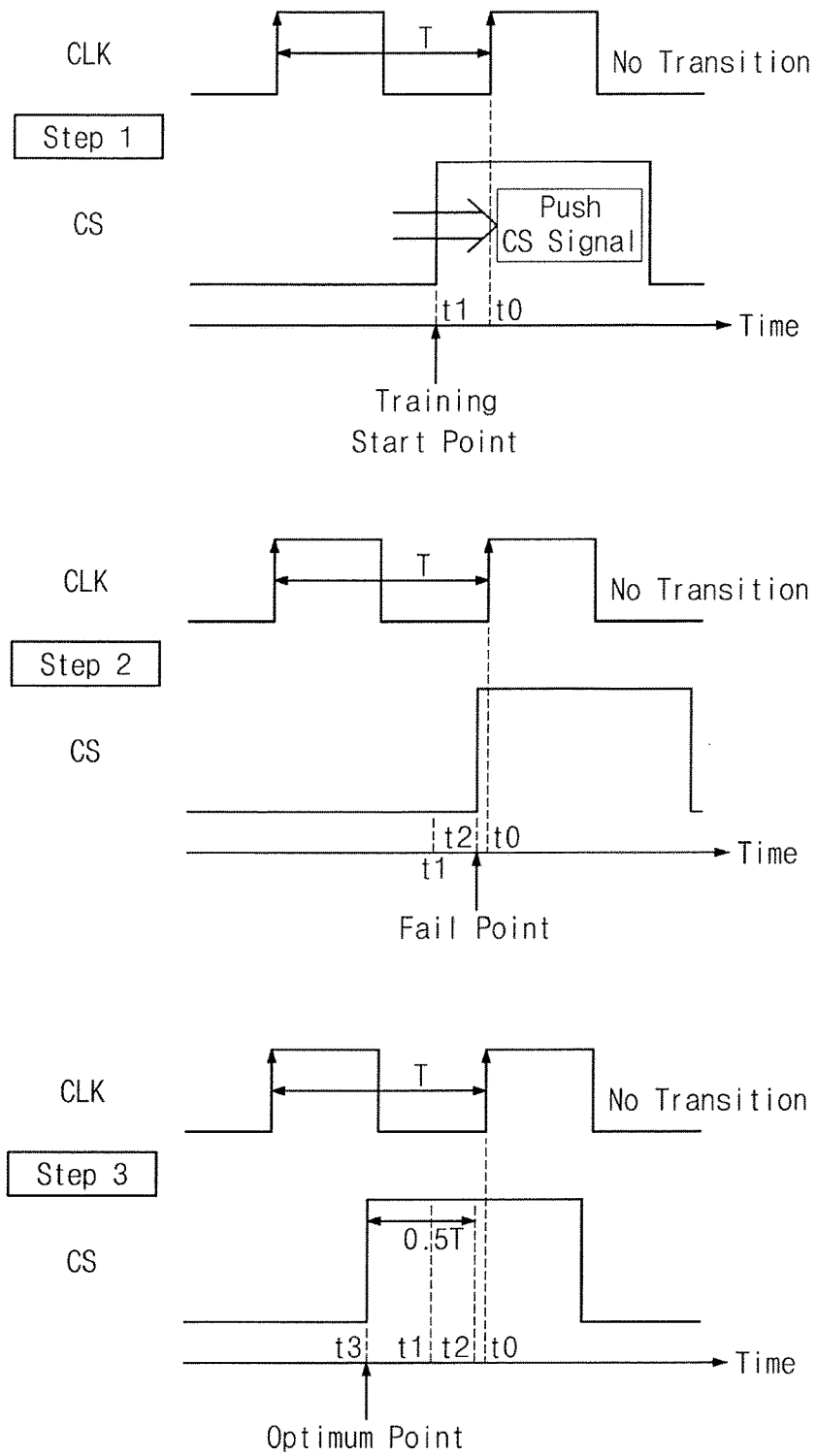
Figure 8:
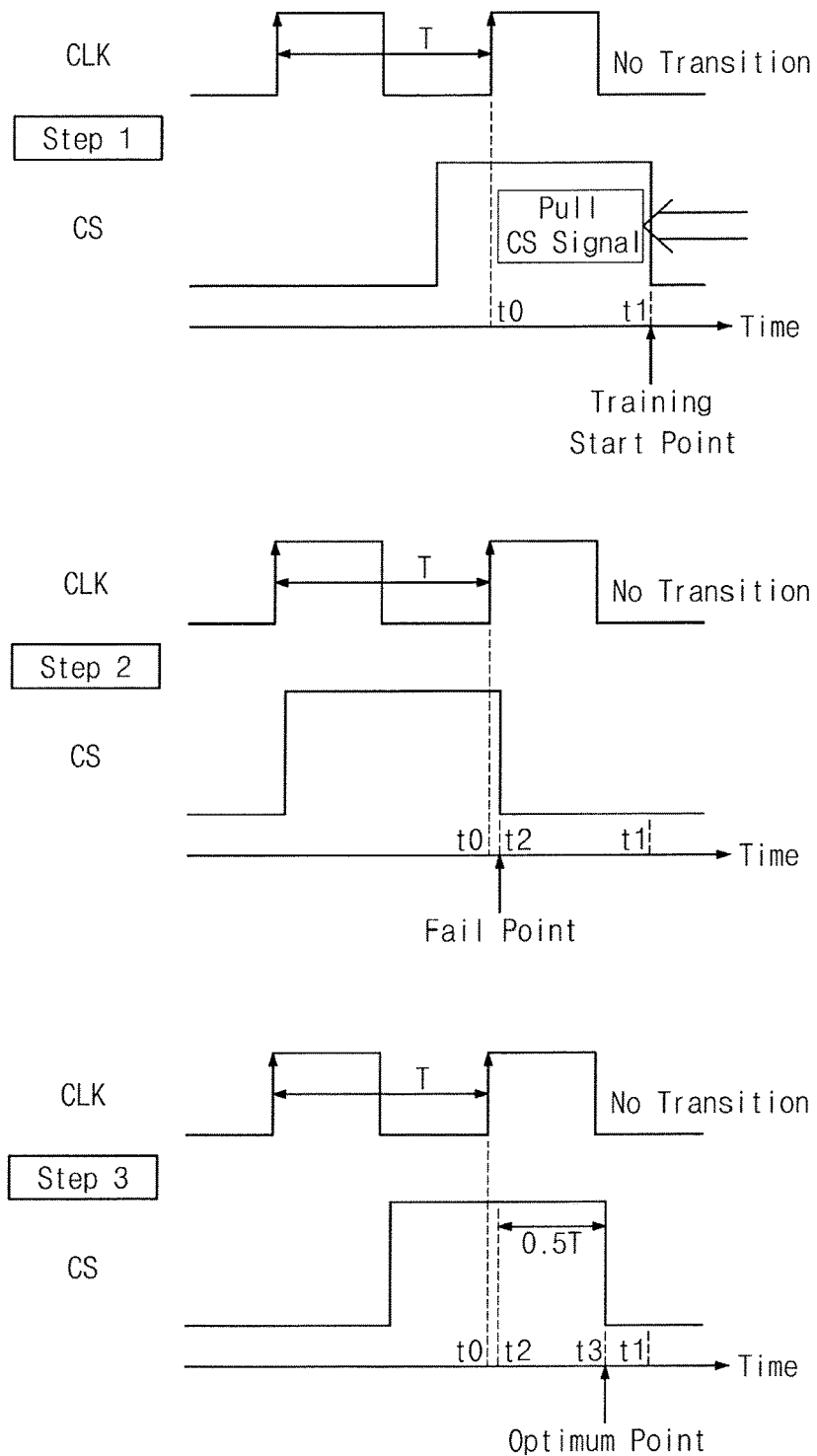

FIGS. 7 to 9 are timing diagrams for describing a training method, according to one or more embodiments of the inventive concept. The timing diagrams of FIGS. 7 to 9 will be described with reference to FIGS. 1 to 4. In the timing diagrams of FIGS. 7 to 9, the host 1100 finds an optimum synchronization time point of the chip select signal CS by performing training on the chip select signal CS based on the training clock signal CLK that does not transition after a reference time point defined in FIG. 1. As discussed herein after, while a training operation is shown with regard to a control signal and a clock signal, it is within the inventive concept to also perform a training operation for a command signal and a clock signal. The training operation of the command signal could be performed in addition to the training for the control signal, or the training operation of the command signal could occur without the control signal training.

In the embodiment of FIGS. 7 to 9, the training clock signal CLK is changed to a logic "0" after a time point "t0" and remains at the changed logic level. The host 1100 performs training for synchronizing the chip select signal CS at the rising edge of the clock signal CLK corresponding to the time point "t0". For example, the training clock signal CLK is set to remain at a logical level of logic "1" after the time point "t0". However, a person of ordinary skill in the art should understand that the synchronizing could occur at a point other than a rising edge of the clock signal (e.g. a falling edge, or another point of the clock signal).

Referring to FIG. 7, the host 1100 may delay the chip select signal CS and provide the delayed chip select signal CS to the memory device 1200. Then, the host 1100 may find a sampling failure time point of the delayed chip select signal CS, at which the memory device 1200 fails to sample the delayed chip select signal CS. In addition, the host 1100 may set the optimum synchronization time point of the chip select signal CS based on the sampling failure time point. Below, a method of training the chip select signal CS will be described with reference to FIG. 7.

First, the chip select signal CS that transitions to a level of logic "1" at a time point "t1" is provided to the memory device 1200 (step 1). Below, the time point "t1" is referred to as a "training start time point". The chip select signal CS remains at a logical level 1 during a period "T" of the clock signal CLK. The host 1100 provides the chip select signal CS to the memory device 1200 while sequentially delaying the chip select signal CS by one reference time unit and determines whether the chip select signal CS is sampled by the memory device 1200. For example, the reference time unit may refer to a time that corresponds to one of a plurality of units that constitute the period "T" of the clock signal CLK.

Next, the host 1100 finds a time point at which the memory device 1200 fails to sample the chip select signal CS (step 2). As illustrated in FIG. 7, the memory device 1200 may fail to sample the chip select signal CS due to lack of the setup time tS when the rising edge of the chip select signal CS is delayed until a time point "t2". Here, the time point "t2" is the sampling failure time point of FIG. 7. As previously discussed, a sampling failure can occur without a period of setup time (tS) or hold time (tH) being sufficient.

The host 1100 sets the optimum synchronization time point for providing the chip select signal CS to the memory device 1200 based on the sampling failure time point "t2" such that the memory device 1200 secures a margin for sampling the chip select signal CS at the rising edge of the clock signal CLK corresponding to the time point "t0" (step 3).

With continued reference to FIG. 7, at step 3 the host 1100 sets the optimum synchronization time point of the chip select signal CS to a time point "t3" that is advanced from the sampling failure time point "t2" by half a period (0.5 T) of the clock signal CLK. Accordingly, in the chip select signal CS, the sampler 1212 may secure the setup time tS and the hold time tH, each of which corresponds to approximately half a period (0.5 T) of the clock signal CLK, with respect to the time point "t2".

Referring to FIG. 8, instead of delaying the chip select signal as shown in FIG. 7, the host 1100 may advance the chip select signal CS and provide the advanced chip select signal CS to the memory device 1200. Then, the host 1100 may find a sampling failure time point of the advanced chip select signal CS, at which the memory device 1200 fails to sample the advanced chip select signal CS. And the host 1100 may set the optimum synchronization time point of the chip select signal CS based on the sampling failure time point. Herein below, a method of training the chip select signal CS will be described with reference to FIG. 8.

First, as shown in FIG. 8, the chip select signal CS that transitions to a level of logic "0" at a time point "t1" is provided to the memory device 1200 (step 1). In this example, the time point "t1" is referred to as a "training start time point". Like the embodiment of FIG. 7, the chip select signal CS remains at a logical level during a period "T" of the clock signal CLK. The host 1100 provides the chip select signal CS to the memory device 1200 while sequentially advancing the chip select signal CS by the reference time unit described with reference to FIG. 7 from the training start time point "0". Then, the host 1100 determines whether the chip select signal CS is sampled by the memory device 1200.

Next, the host 1100 finds a time point at which the memory device 1200 fails to sample the chip select signal CS (step 2) as there is an insufficient time for a hold operation. As illustrated in FIG. 8, the memory device 1200 may fail to sample the chip select signal CS due to lack of the hold time tH when the falling edge of the chip select signal CS is advanced until a time point "t2". Here, the time point "t2" is the sampling failure time point.

The host 1100 sets the optimum synchronization time point of the chip select signal CS, which is synchronized at the rising edge of the clock signal CLK at the time point "t0", to a time point "t3" that is delayed from the sampling failure time point "t2" by half a period (0.5 T) of the clock signal CLK. Accordingly, in the chip select signal CS, the sampler 1212 may secure the setup time tS and the hold time tH, each of which corresponds to approximately half a period (0.5 T) of the clock signal CLK, with respect to the time point "t2". The method of training the chip select signal CS provided to the memory device 1200 in the SDR manner is described with reference to FIGS. 7 and 8. As described above, the chip select signal CS may be provided to the memory device 1200 in the double data rate DDR manner. A method of training the chip select signal CS provided to the memory device 1200 in the DDR manner is described with reference to FIG. 9.

At a time point "t1" of FIG. 9, the chip select signal CS that transitions to a level of logic "1" is provided to the memory device 1200 (step 1). Like that described with reference to FIGS. 7 and 8, the time point "t1" is referred to as a "training start time point". In the embodiment of FIG. 9, the chip select signal CS that is provided to the memory device 1200 in the double data rate DDR manner remains at a logical level during half a period (0.5 T) of the clock signal CLK. The host 1100 provides the chip select signal CS to the memory device 1200 while sequentially delaying the chip select signal CS by the reference time unit described with reference to FIG. 7. In addition, the host 1100 determines whether the chip select signal CS is sampled by the memory device 1200.

Next, the host 1100 identifies a time point at which the memory device 1200 fails to sample the chip select signal CS (step 2). As illustrated in FIG. 9, the memory device 1200 may fail to sample the chip select signal CS due to lack of the setup time tS when the rising edge of the chip select signal CS is delayed until a time point "t2". Here, the time point "t2" is the sampling failure time point of FIG. 9.

The host 1100 sets the optimum synchronization time point of the chip select signal CS, which is synchronized at the rising edge of the clock signal CLK at the time point "t0", to a time point "t3" that is advanced from the sampling failure time point "t2" by a quarter (0.25 T) of a period of the clock signal CLK. Accordingly, in the chip select signal CS, the sampler 1212 may secure the setup time tS and the hold time tH, each of which corresponds to approximately a quarter (0.25 T) of a period of the clock signal CLK, with respect to the time point "t2".

For example, to provide a sufficient hold margin to the sampler 1212 upon performing the training of FIG. 9, the chip select signal CS that remains at a logical level during not half a period 0.5 T but a period "T" of the clock signal CLK may be provided to the memory device 1200. However, during normal operations of the memory device 1200, such as a read operation and a write operation, after the training is completed, the chip select signal CS may be provided to the memory device 1200 in the DDR manner. For example, during a normal operation of the memory device 1200, the chip select signal CS that remains at a logical level during half a period 0.5 T of the clock signal CLK may be provided to the memory device 1200.

The method of training the chip select signal CS sampled at the rising edge of the clock signal CLK is described with reference to FIG. 9. However, in the case where the chip select signal CS is provided to the memory device 1200 in the double data rate DDR manner, the memory device 1200 may sample the chip select signal CS even at the falling edge of the clock signal CLK. Accordingly, the host 1100 iteratively performs the training process, which is described with reference to FIG. 9, on the falling edge of the clock signal CLK. With the above description, through the training method of FIG. 9, the sampler 1212 may secure a sufficient sampling margin for sampling the chip select signal CS at the rising edge and the falling edge of the clock signal CLK, respectively.

The training method in which (described with reference to FIG. 7) of finding the sampling failure time point by delaying the chip select signal CS from the time point "t0" and finding an optimum synchronization time point based on the sampling failure time point is applied to the method of training the chip select signal CS provided to the memory device 1200 in the DDR manner is described with reference to FIG. 9. However, likewise, a person of ordinary skill in the art should understand that the training method in which the training method (described with reference to FIG. 8) of finding the sampling failure time point by delaying the chip select signal CS from the time point "t0" and finding an optimum synchronization time point based on the sampling failure time point is applied to the training method described with reference to FIG. 9.

According to the training methods described with reference to FIGS. 7 to 9, the memory system 1000 of FIG. 1 may set an optimum synchronization time point of the chip select signal CS, at which it is possible to sufficiently secure a sampling margin of the sampler 1212. Also, it may be possible to prevent the chip select signal CS from being synchronized at an unintended rising edge of the clock signal CLK.

Figure 10:
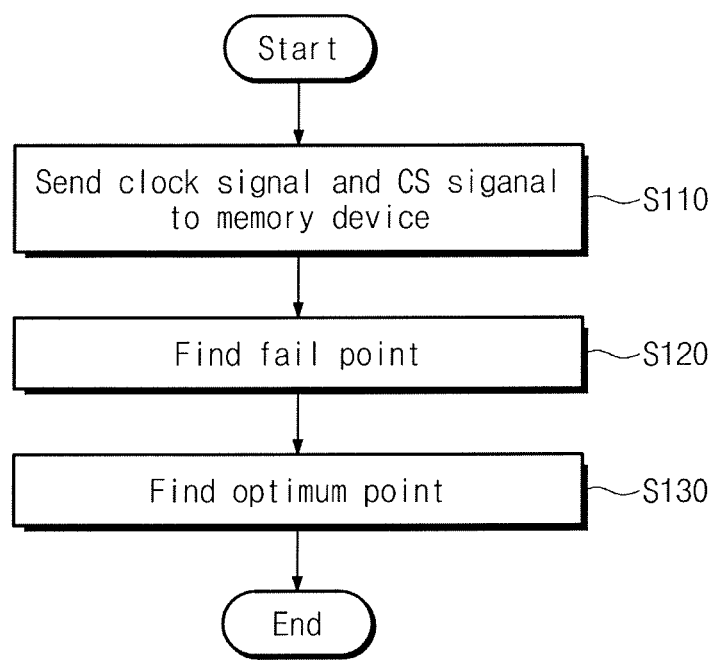
FIG. 10 is a flowchart illustrating a training method of a memory system of FIG. 1, according to an embodiment of the inventive concept.

FIG. 10 is a flowchart illustrating a training method of a memory system of FIG. 1, according to an embodiment of the inventive concept. The flowchart of FIG. 10 will be described with reference to FIGS. 1, 2, 3, and 7 to 9.

In operation S110, the host 1100 sends the above-described training clock signal CLK to the memory device 1200 to synchronize the chip select signal CS at at least one of a rising edge of a reference time point and a falling edge of a reference time point of the clock signal CLK. The host 1100 starts training on the chip select signal CS, which is provided to the memory device 1200, based on the training clock signal CLK. As previously discussed, a training clock signal may not transition after a reference time.

In operation S120, the training controller 1110 of the host 1100 finds a sampling failure time point at which the memory device 1200 fails to sample the chip select signal CS. The data comparator 1111 of the training controller 1110 determines whether the chip select signal CS is successfully sampled, by comparing training data with data read from the memory device 1200. The training controller 1110 finds the sampling failure time point of the chip select signal CS based on the determination result. In operation S130, the training optimizer 1112 of the host 1100 sets an optimum synchronization time point of the chip select signal CS, at which it is possible to secure a sampling margin sufficiently in which the sampler 1212 of the memory device 1200 samples the chip select signal CS at the one edge. At least one way to find the sampling failure time point of the chip select signal CS (operation S120) and a way to set the optimum synchronization time point of the chip select signal CS (operation S130) are described with reference to FIGS. 7 to 9, and such discussion will not be repeated here.

FIG. 11 is a block diagram illustrating a non-limiting example of a user system to which a memory device may be applied, according to an embodiment of the inventive concept. Referring to FIG. 11, a user system 10000 may include an application processor 11000, a memory module 12000, a network module 13000, a storage module 14000, and a user interface 15000.

The application processor 11000 may drive, for example, hardware and an operating system that are included in the user system 10000. For example, the application processor 11000 may include one or more controllers for controlling elements of the user system 10000, such as interfaces, graphics engines, etc. The application processor 11000 may be implemented with a system-on-chip (SoC).

The memory module 12000 may operate as a main memory, a working memory, a buffer memory, or a cache memory of the user system 10000. The memory module 12000 may be implemented with a volatile random access memory, such as a DRAM, an SDRAM, a double date rate (DDR) SDRAM, a DDR2 SDRAM, a DDR3 SDRAM, an LPDDR SDRAM, an LPDDR2 SDRAM, or a low power DDR3 (LPDDR3) SDRAM or a nonvolatile random access memory, such as a phase-change RAM (PRAM), a magnetic RAM (MRAM), a resistive RAM (RRAM), or a ferroelectric RAM (FRAM), just to name some non-limiting possibilities.

For example, a controller, which is included in the application processor 11000, and the memory module 12000 may constitute the memory system 1000 described with reference to FIGS. 1 to 10. For example, the controller included in the application processor 11000 may correspond to the host 1100 of FIG. 1, and the memory module 12000 may include the memory device 1200 of FIG. 1. However, a person of ordinary skill in the art should understand and appreciate that other configurations of the memory system are within the inventive concept described herein.

In addition, the controller included in the application processor 11000 and the memory module 12000 may perform training on signals provided from the application processor 11000 to the memory module 12000 through the training method described with reference to FIGS. 1 to 10.

With continued reference to FIG. 11, the network module 13000 may communicate with external devices. For example, the network module 13000 may support wireless communications, such as code division multiple access (CDMA), global system for mobile communication (GSM), wideband CDMA (WCDMA), CDMA-2000, time division multiple access (TDMA), long term evolution (LTE), Wimax, WLAN, UWB, Bluetooth, and WI-FI. Here, the network module 13000 may be included in the application processor 11000.

The storage module 14000 may store data. For example, the storage module 14000 may store data received from the application processor 11000. Alternatively, the storage module 14000 may transmit data stored therein to the application processor 11000. For example, the storage module 14000 may be implemented with a nonvolatile semiconductor memory device such as a PRAM, an MRAM, a RRAM, a NAND flash memory, a NOR flash memory, or a three-dimensional NAND flash memory, just to name some non-limiting possibilities.

The user interface 15000 may include interfaces which input data or a command to the application processor 11000 or output data to an external device. For example, the user interface 15000 may include user input interfaces such as a keyboard, a keypad, a button, a touch panel, a touch screen, a touch pad, a touch ball, a camera, a microphone, a gyroscope sensor, a vibration sensor, and piezoelectric element. The user interface 15000 may further include user output interfaces such as a liquid crystal display (LCD), an organic light-emitting diode (OLED) display device, an active matrix OLED (AMOLED) display device, a light-emitting diode (LED), a speaker, and a motor.

According to an embodiment of the inventive concept, the timing margin of signals that a host provides to a memory device increases, and the signals may be prevented from being synchronized at an unintended edge of a clock signal.

While the inventive concept has been described with reference to exemplary embodiments of the inventive concept, a person of ordinary skill in the art will understand that various changes and modifications may be made without departing from the spirit and scope of the inventive concept. Therefore, it should be understood that the above embodiments do not limit the inventive concept and appended claims to the embodiments provided herein.

What is claimed is:

1. A training method comprising:
providing, at a memory controller, a clock signal to a memory device to synchronize a control signal at a reference time point of the clock signal, in which the clock signal does not transition after the reference time point;
finding a failure time point at which the memory device fails to sample the control signal at the reference time point of the clock signal, based on the clock signal and the control signal; and
setting, at the memory controller, a synchronization time point of the control signal, at which the memory device secures a sampling margin for sampling the control signal at the reference time point, based on the failure time point.

2. The training method of claim 1, wherein the finding of the failure time point is based on the control signal being sequentially delayed to be iteratively provided to the memory device.

3. The training method of claim 2, wherein the setting of the synchronization time point is set to a time point that is advanced from the failure time point by half a period of the clock signal, and
wherein a sampler of the memory device samples the control signal at one edge of a rising edge and a falling edge of the clock signal and the reference time point comprises the one edge.

4. The training method of claim 2, wherein the setting of the synchronization time point of the control signal is set to a time point that is advanced from the failure time point by a quarter of a period of the clock signal,
wherein a sampler of the memory device samples the control signal at a rising edge and a falling edge of the clock signal, respectively, and the reference time point comprises the rising edge and the falling edge of the clock signal, and
wherein the memory controller iteratively performs the providing of the clock signal, the finding of the failure time point, and the setting of the synchronization time point of the control signal on the rising edge and the falling edge of the clock signal.

5. The training method of claim 1, wherein the finding of the failure time point is based on the control signal being sequentially advanced to be iteratively provided to the memory device.

6. The training method of claim 5, wherein the setting of the synchronization time point of the control signal is set to a time point that is delayed from the failure time point by half a period of the clock signal, and
wherein a sampler of the memory device samples the control signal at one edge of a rising edge and a falling edge of the clock signal and the reference time point comprises the one edge.

7. The training method of claim 5, wherein the setting of the synchronization time point of the control signal is set to a time point that is delayed from the failure time point by a quarter of a period of the clock signal,
wherein the memory device samples the control signal at a rising edge and a falling edge of the clock signal, respectively, and the reference time point comprises the rising edge and the falling edge of the clock signal, and
wherein the memory controller iteratively performs the providing, the finding, and the setting on the rising edge and the falling edge of the clock signal.

8. The training method of claim 1, further comprising: generating, at a memory controller, the clock signal.

9. A memory device comprising:
a latch including an input buffer configured to receive a control signal from a host; and
a sampler configured to sample the control signal provided from the input buffer in synchronization with a clock signal provided from the host;
wherein in response to executing a training operation on the memory device that includes synchronization of the control signal at a reference time point of the clock signal, and wherein the clock signal does not transition after the reference time point, the training operation is executed based on a failure time point at which the sampler fails to sample the control signal at the reference time point.

10. The memory device of claim 9, wherein the sampler samples the control signal at one edge of a rising edge and a falling edge of the clock signal and the reference time point comprises the one edge.

11. The memory device of claim 10, wherein when the training operation is executed, the control signal is sequentially delayed to be iteratively provided to the sampler, and a synchronization time point of the control signal is set to a time point that is advanced from a sampling failure time point of a delayed control signal provided by half a period of the clock signal.

12. The memory device of claim 10, wherein when the training operation is executed, the control signal is sequentially advanced to be iteratively provided to the sampler, and a synchronization time point of the control signal is set to a time point that is delayed from a sampling failure time point of an advanced control signal provided by half a period of the clock signal.

13. The memory device of claim 9, wherein the sampler samples the control signal at a rising edge and a falling edge of the clock signal, respectively, and the reference time point comprises the rising edge and the falling edge of the clock signal.

14. The memory device of claim 12, wherein when the training operation is executed, the control signal is sequentially delayed to be iteratively provided to the sampler, and a synchronization time point of the control signal is set to a time point that is advanced from a sampling failure time point of a delayed control signal provided by a quarter of a period of the clock signal, and wherein the training is iteratively performed on the rising edge and the falling edge of the clock signal.

15. The memory device of claim 13, wherein when the training operation is executed, the control signal is sequentially advanced to be iteratively provided to the sampler, and a synchronization time point of the control signal is set to a time point that is advanced from a sampling failure time point of an advanced control signal provided by a quarter of a period of the clock signal, and wherein the training is iteratively performed on the rising edge and the falling edge of the clock signal.

16. A memory device comprising:
a clock buffer configured to receive a clock signal from a host, wherein the clock signal does not transition after a reference time point;
an input buffer configured to receive a control signal from the host;
a sampler configured to sample the control signal provided from the input buffer in synchronization with the reference time point of the clock signal;
a command address latch that receives a command signal and an address signal from the host; and
a memory cell array in communication with the sampler and the command address latch, the memory cell array configured to store training data;
wherein the control signal is synchronized with the clock signal in response to a control signal training operation initiated by the host,
wherein the command signal is synchronized with the clock signal in response to a command signal training operation initiated by the host, and
wherein the control signal training operation is executed based on a failure time point at which the sampler fails to sample the control signal at the reference time point.

17. The memory device according to claim 16, wherein the control signal is synchronized at an edge of the clock signal.

18. The memory device according to claim 16, wherein the command signal is synchronized at an edge of the clock signal.

19. The memory device of claim 16, further comprising:
a sense amplifier that reads the training data in the memory cell array, and
a driver that receives the training data from the sense amplifier and outputs the training data to the host.

* * * * *